United States Patent
Legatti

(10) Patent No.: US 9,748,760 B2
(45) Date of Patent: Aug. 29, 2017

(54) DEVICE FOR DETECTING A FAULT IN AN AC SUPPLY

(71) Applicant: Shakira Limited, Ballinasloe (IE)

(72) Inventor: Raymond Legatti, Belleair, FL (US)

(73) Assignee: Shakira Limited, Ballinasloe (IE)

( * ) Notice: Subject to any disclaimer, the term of this patent is extended or adjusted under 35 U.S.C. 154(b) by 95 days.

(21) Appl. No.: 14/738,264

(22) Filed: Jun. 12, 2015

(65) Prior Publication Data

US 2016/0365718 A1    Dec. 15, 2016

(51) Int. Cl.
| | |
|---|---|
| *H02H 3/00* | (2006.01) |
| *H02H 3/08* | (2006.01) |
| *H02H 3/04* | (2006.01) |
| *H02H 3/16* | (2006.01) |
| *H02H 3/33* | (2006.01) |
| *G01R 31/42* | (2006.01) |

(52) U.S. Cl.
CPC ............. *H02H 3/08* (2013.01); *G01R 31/42* (2013.01); *H02H 3/044* (2013.01); *H02H 3/162* (2013.01); *H02H 3/335* (2013.01)

(58) Field of Classification Search
USPC ..................................................... 361/42–50
See application file for complete search history.

(56) References Cited

U.S. PATENT DOCUMENTS

| | | |
|---|---|---|
| 8,964,340 B2 | 2/2015 | Ward et al. |
| 8,974,494 B2 | 3/2015 | Paulk et al. |
| 2007/0035898 A1* | 2/2007 | Baldwin ............... H01H 83/04 361/42 |
| 2010/0013491 A1 | 1/2010 | Hooper et al. |
| 2014/0009856 A1* | 1/2014 | Ward ..................... H02H 3/162 361/42 |

* cited by examiner

*Primary Examiner* — Danny Nguyen
(74) *Attorney, Agent, or Firm* — Withrow & Terranova, P.L.L.C.

(57) ABSTRACT

A device for detecting a fault in an AC supply comprising a detection circuit for detecting a fault in an AC supply to a load and providing a corresponding output. A disconnect circuit disconnects the load from the supply in response to an output from the detection circuit. The device also includes a generator of intermittent test pulses, and a test circuit coupled to the detection circuit and containing a first solid state switch. Each test pulse turns on the solid state switch for the duration of the test pulse so that a current simulating the fault flows intermittently in the test circuit and a corresponding output is provided by the detection circuit. The device further comprising means to disable the disconnect circuit in response to each test pulse.

6 Claims, 2 Drawing Sheets

DEVICE FOR DETECTING A FAULT IN AN AC SUPPLY

FIELD OF THE DISCLOSURE

This invention relates to devices for detecting a fault in an AC supply. Such devices include, for example, residual current devices (RCDs), also known as ground fault circuit interrupters (GFCIs), related devices such as equipment leakage circuit interrupters (ELCIs), and arc fault detectors (AFDs).

BACKGROUND

RCDs can be divided into three types:

ML: The contacts in these devices are Mechanically Latched, and when closed the contacts in these devices will not open in the event of loss of supply.

ELO: The contacts in these devices are Electrically Latched, and the contacts will open on loss of supply and remain Open on restoration of the supply.

ELR: The contacts in these devices are Electrically Latched, and the contacts will open on loss of supply but will Reclose automatically on restoration of the supply.

STEOL (Self Test and End of Life): The STEOL acronym is now widely used for GFCIs and RCDs incorporating a self testing (ST) function that verifies the correct operation of the GFCI/RCD circuit.

The end of life (EOL) function provides an indication to the user that the RCD is no longer able to provide its protective function. EOL indication can be by audible or visual means (e.g. a buzzer or an LED), and the EOL function may also include automatic opening of the main contacts or automatic reopening of the contacts if they are manually reset. Commonly owned U.S. Pat. Nos. 8,964,340; 8,974,494; as well as US Application No. US 2010/0013491, Hooper describe an RCD with STEOL. The disclosures of such are incorporated herein by reference in their entireties.

SUMMARY

It is an object of the invention to provide devices for detecting a fault in an AC supply for use in RCDs and other suitable applications and which offer significant improvements over the aforementioned prior art.

According to the present invention there is provided a device for detecting a fault in an AC supply, comprising a detection circuit for detecting a fault in an AC supply to a load and providing a corresponding output, a disconnect circuit to disconnect the load from the supply in response to an output from the detection circuit, a generator of intermittent test pulses, and a test circuit coupled to the detection circuit and containing a first solid state switch, each test pulse turning on the solid state switch for the duration of the test pulse so that a current simulating the fault flows intermittently in the test circuit and a corresponding output is provided by the detection circuit, the device further comprising means to disable the disconnect circuit in response to each test pulse.

An advantage of the invention is that the test pulses generated by the pulse generator do not in themselves test the device for faults, but rather they intermittently enable a test circuit to test the device. This allows the pulse generator to be designed without regard to the high energy characteristics of the pulses needed to test the device, which are instead provided by the test circuit. This enables an efficient design and saves costs.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

In the present specification an electromagnetic switch is an electrical switch with mechanical contacts which are operated (i.e. opened and/or closed) by a magnetic field produced by current flowing in a coil, usually a solenoid. Depending on the particular application for which the switch is designed, the solenoid may or may not have a ferromagnetic polepiece and/or armature, either of which may be a permanent magnet. Electromagnetic switches are well-known in the art, and may be referred to as relays in certain applications.

Figure 1:
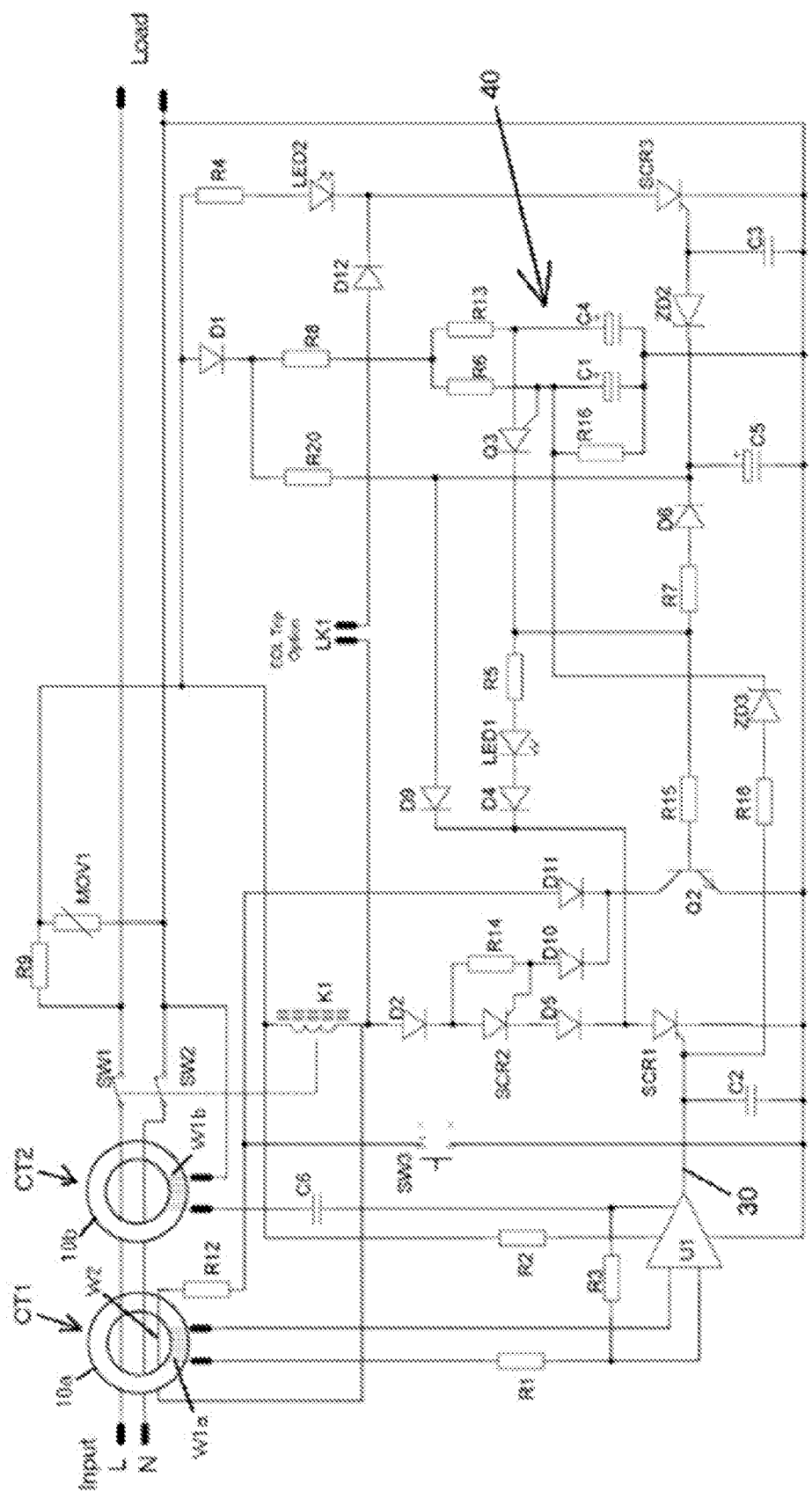
FIG. 1 is a circuit diagram of an ML RCD according to the first embodiment of the invention.

FIG. 1 is a circuit diagram of an RCD with a mechanically latching (ML) contact closing mechanism. The ML mechanism does not require electrical power to close its contacts or to retain its contacts in the closed state but it does require electrical power to cause its contacts to open. The ML device is therefore closed manually.

In FIG. 1 a single phase AC mains supply comprising live L and neutral N conductors is connected to a load (not shown) via two switch contacts SW1 and SW2 in the L and N conductors respectively. The supply conductors are passed through the toroidal ferromagnetic cores 10a and 10b of two current transformers CT1 and CT2. Current transformer CT1 is provided for the detection of differential fault currents, and current transformer CT2 is provided for the detection of a double grounded neutral (DGN) condition that can desensitize the fault current detection level. CT2 may be omitted in applications where DGN detection is not required.

The conductors L, N passing through the core 10a form primary windings of the transformer CT1 (the term "winding" is used in accordance with conventional terminology, even though the conductors L, N pass directly through the core rather than being wound on it). The primary currents flowing in the live and neutral conductors L and N flow in opposite directions through the core 10a. Under normal conditions (i.e. no residual current), the vector sum of the primary currents is zero. However, in the presence of a residual current caused by, for example, a person touching the live conductor L and diverting part of the current to ground, the primary currents become unbalanced. This leads to a differential current IΔ in the primary conductors L and N, i.e. a non-zero vector sum of the primary currents, which induces a mains frequency current in the secondary winding W1a.

The output of the secondary winding W1a is fed to a differential current detector circuit U1 and associated components. U1 may be an industry standard RCD integrated circuit such as a WA050 (Western Automation), RV4145 (Fairchild) or FAN 4147 (Fairchild). Since circuit configurations for U1 are well known the individual components are not described herein.

In the event of a differential current IΔ in excess of a predetermined level, U1 will produce an output on line 30 that will turn on a normally off silicon controlled rectifier SCR1. A further silicon controlled rectifier SCR2 will have a positive voltage constantly applied to its gate via diode D2 and resistor R14, and as soon as SCR1 turns on it will provide a current path to ground to enable a current to flow into the gate of SCR2 and thus turn it on and thereby cause solenoid K1 to be energised. The solenoid K1 together with the load contacts SW1, SW2 forms an electromechanical switch of known type, in which energisation of the solenoid K1 by a current of sufficient amplitude causes automatic opening of the contacts SW1 and SW2. Since in the present case the circuit component values are selected to ensure that the solenoid K1 is thus sufficiently energised when SCR1 turns on, the contacts SW1 and SW2 will open In the event of a differential current IΔ in excess of the predetermined level. The contacts SW1, SW2 will remain in the open state until they are manually reclosed by the user (the manual closure means is not shown, but typically includes a reset button or the like coupled to the contacts).

If DGN detection is required, the second (DGN) CT and capacitor C6 provide for this function.

A manually operable switch SW3 and resistor R12 form a manual test circuit. When SW3 is manually closed, a test current will flow via R12 from ground through a further primary winding W2 on the core 10a. From the winding W2 the test current flows to the live conductor L via the solenoid K1 and R9, but the test current by itself is too small to sufficiently energise K1 to turn SCR1 on and open the load contacts. The test current will be seen as a differential current IΔ by U1 and is designed to be above the predetermined threshold referred to above to cause the contacts SW1, SW2 to open, thus verifying to the user that the RCD is functioning correctly. The test current drawn under a test condition is limited by relevant product standards to some maximum value. In the case of North America, the current is limited to 9 mA for a typical 6 mA GFCI, and in IEC the test current is limited to 2.5 times the rated tripping current of the device. The value of resistor R12 is set as appropriate.

FIG. 1 shows a self-test (ST) pulse generator 40 comprising Q3 and associated circuitry. This is a circuit intended to produce a continuous stream of intermittent pulses for the purpose of testing the RCD at frequent intervals. Such pulse generating circuits are well known and details of such circuits are shown in the prior art cited herein.

The ST pulse generator will produce a continuous stream of positive-going pulses of predetermined duration at predetermined intervals. Each of these ST pulses will turn on a transistor Q2 of a test circuit comprising Q2, D11, R12 and W2. Turning on Q2 will in turn pull the gate of SCR2 to ground via D10 and also cause a test current to flow to ground via D11 and resistor R12. This test current will be detected by U1 and will turn on SCR1 as described above. However, because of the grounding of SCR2's gate, the current that would normally flow into SCR2 gate when SCR1 turns on will no longer be available to enable SCR2 to turn on, and thus solenoid K1 will not be energised and the contacts SW1, SW2 will not open when SCR1 turns on. However, SCR1 turning on will cause LED1 to light up, thus indicating that the self test feature is active and that the test current has been detected. SCR1 turning on will also terminate the ST pulse, thus causing Q2 to turn off and terminate the test current flowing through R12. Each self test pulse will also provide a charging current to capacitor C5 via R7 and D6. However, each time SCR1 turns on, C5 will be discharged via D9. In the event that SCR1 fails to turn on during the ST pulse, C5 will continue to acquire charge from one or more ST pulses and when the voltage on C5 reaches the breakover voltage of ZD2, silicon controlled rectifier SCR3 will turn on and cause LED 2 to be lit and thus indicate an End of Life (EOL) condition.

Resistor R20 may be included to provide a trickle current to charge up C5 so that in the event of the ST pulses ceasing to flow for any reason, C5 will charge up without interruption and initiate the EOL condition. In the event of failure of the ST circuit, C5 will charge up via R20 and when the charge reaches the breakover voltage of ZD2, SCR3 will turn on and activate the EOL state. The values of C5, R20 and ZD2 can be selected to provide an appropriate time delay for activation of the EOL state. LED2 will indicate the EOL state when SCR3 turns on.

A DGN condition will result in an oscillatory action causing a high frequency signal to be delivered to U1. SCR1 will normally turn on under this condition and the solenoid will be energised by the flow of current through SCR1 and SCR2 and the associated diodes, resulting in opening of the contacts. If SCR1 fails to turn on under a DGN condition, SCR3 will turn on due to the accumulating charge on C5 to indicate failure and the EOL state.

If it is desirable to also open the contacts under an EOL condition, a connection can be made from the end of solenoid K1 to the anode of SCR3 by closing a link LK1. LK1 can be a switch, but it may be a link that can be placed in situ during manufacturing, or it can be a permanent connection. In this case, under an EOL condition the contacts SW1, SW2 will open to indicate the EOL state, and LED2 will no longer be lit. In the event of failure of the solenoid itself, the contacts will not open but LED2 will then be lit to indicate the EOL state. In the event that the contacts are reclosed by manual means, the GFCI will revert to the EOL state automatically as long as the EOL state persists.

It can be seen that in U.S. Pat. No. 8,964,340 referred to above the ST pulse was used to directly generate a test current that flowed through the differential current sensing CT1 for verification of the ST function. However, this required the pulse generator to produce an output of considerable energy so as to produce a detectable level of test current. In the embodiment described herein, the ST circuit utilises the test resistor R12 (equivalent to R105 in FIG. 11 of U.S. Pat. No. 8,964,340) to produce the test current by connecting R12 to ground via D11 and Q2, and thereby obviating the need for a high energy pulse generator or the need for a separately generated ST test current. (The power requirement can be further reduced by using multiple turns in the test winding W2 on CT1). This arrangement has the added advantage of verifying the integrity of the test winding and the test resistor R12 during each ST cycle, and activation of the EOL state in the event of a failure in any of these key components. This feature was not present in the prior art.

It should be noted that the pulses produced by the ST pulse generator are synchronised with the positive going half cycles of the mains supply so that a test current can flow through R12 and D11 coincident with the ST pulse and the positive going half cycles of the mains supply, and thereby ensure that SCR1 can turn on and conduct for each ST pulse.

In the event that the differential current detecting circuitry fails for any reason or SCR1 fails to turn on in response to a fault or an ST pulse, the ST pulses will flow into C5 via R7 and D6 and cause it to acquire charge sufficient to exceed the breakover voltage of ZD2 and turn on SCR3. The values of R7, C5 and ZD2 can be selected so as to cause the EOL circuit to be activated after a predetermined time or number of ST Pulses.

In summary, failure of the user test circuit, the solenoid or any key component in the differential current detecting circuit or the ST pulse generating circuit will result in an EOL condition.

In the case of a residual current fault condition, SCR1 will turn on and cause activation of the solenoid and opening of the load contacts. With the RCD and STEOL circuitry being connected on the load side of the load contacts as shown, all of this circuitry will be disabled when the contacts are opened.

Over-voltage conditions pose a danger to people and equipment, and it may be desirable to trip the RCD under such conditions. This can be achieved by the addition of ZD3 and R18 which are used to detect a dangerous over-voltage condition on the mains supply. In the event of a sustained overvoltage condition, the voltage across R16 will exceed a certain value sufficient to break over ZD3 and cause SCR1 to turn on and cause the contacts to open. If the RCD and the ST circuitry are connected on the supply side of the contacts, it may be necessary to omit the overvoltage detection function.

Figure 2:
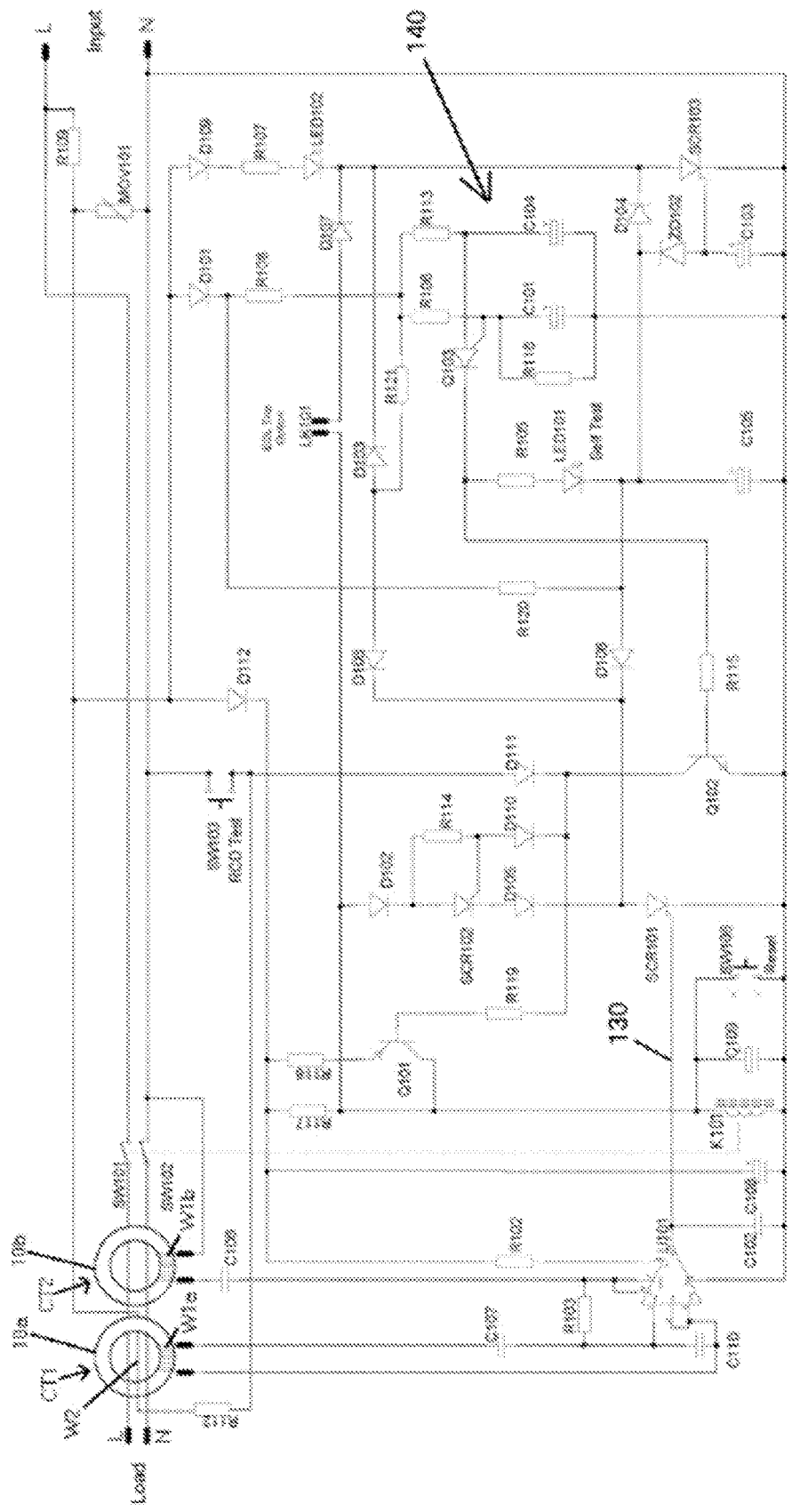
FIG. 2 is a circuit diagram of an ELR RCD according to the second embodiment of the invention.

FIG. 2 is a circuit diagram of an ELR RCD with an electrically latching (EL) contact closing mechanism. The EL mechanism comprises an electromagnetic switch of known type formed by the solenoid K101 and associated load contacts SW101 and SW102. Contrary to the situation in FIG. 1, in this case the electromagnetic switch requires electrical energy to close its load contacts SW101 and SW102 and to retain the contacts in the closed state. More particularly, the switch requires a current flow above a so-called "closing current" to flow in the solenoid K101 to close the load contacts, such contacts thereafter being held closed provided the current in the solenoid does not fall below a so-called "holding current", which is less than the closing current. A reduction of the solenoid current below the holding current will cause automatic opening of the contacts. The ELR RCD will close automatically on provision of the mains supply, and can be manually reclosed after opening on a fault.

The differential current sensing, DGN and the STEOL circuits are substantially the same as described for FIG. 1. Components in FIG. 2 which are the same or equivalent to components in FIG. 1 have been given the same reference numerals, plus 100. For example, Q2 in FIG. 1 becomes Q102 in FIG. 2. The mains input is now shown at the right hand side of the circuit, and the output to the load at the left hand side.

The solenoid coil K101 is connected across the mains supply via D112 and R117 (Q101 is normally off), and the DC voltage across the coil is smoothed by capacitor C109. The current flowing through solenoid K101 via R117 is below the holding current and thus insufficient to energise the solenoid sufficiently to close its associated load contacts SW101 and SW102.

The ST pulses from pulse generator 140 which arrive at Q102 cause it to turn on for short periods at regular intervals as previously described. However, in this embodiment, Q102 turning on causes Q101 to turn on by pulling R119 low. This provides a substantially increased current through the solenoid K101 via R118. This increased current is greater than the closing current and sufficiently energises the solenoid K101 to close the load contacts SW101 and SW102. These contacts remain closed when Q101 turns off after the end of the ST pulse, because the current flowing through K101 via R117 is above the holding current. Although Q102 and Q101 will continue to turn on at regular intervals, they will have no impact on the electromagnetic switch once it is energised and its contacts SW101 and SW102 are closed.

It can be seen that FIG. 2 circuit arrangement is for an ELR type RCD because whenever power is applied, the load contacts SW101 and SW102 will close automatically.

In the event of a residual current fault, SCR101 will be turned on by U101 and this will discharge C119 sufficiently to ensure de-energisation of the solenoid K101 and automatic opening of the contacts SW101 and SW102. SCR101 will remain turned on by a holding current flowing through it. This is derived from D112, C108, R117, D102, SCR102 and D105. Manual closure of a reset switch SW106 will cause SCR101 to turn off. When SW106 is released, the ST pulses arriving at Q102 will cause Q101 to turn on and provide a closing current to K101.

Resistor R120 may be included to provide a trickle current to charge up C105 so that in the event of the ST pulses ceasing to flow for any reason, C105 will charge up without interruption and initiate the EOL condition. In the event of failure of the ST circuit, C105 will charge up via R120 and when the charge reaches the breakover voltage of ZD102, SCR103 will turn on and activate the EOL state. The values of C105, R120 and ZD102 can be selected to provide an appropriate time delay for activation of the EOL state. LED102 will indicate the EOL state when SCR103 turns on.

If it is desirable to open the contacts under an EOL condition, a connection can be made from the top of solenoid K101 to the anode of SCR103 via the link LK101 and D107. In this case, the contacts will open and LED102 will remain lit under an EOL condition.

It would be advantageous to disable the ST pulses during a residual current fault condition or an EOL condition. Under a fault condition, SCR101 will turn on and remain on and this will disable the ST pulse generator via D108. Under an EOL state, the ST pulse generator will be disabled by SCR103 and D103.

If it is desired to open the contacts SW101 and SW102 in the event of an EOL condition, diode D107 may be advantageously connected from the top of the solenoid coil K101 to SCR103 anode to facilitate this.

It should be noted that the ST pulses are synchronised with the positive half cycles of the mains supply so that all relevant polarised components such as diodes and SCRs can conduct during each ST pulse.

Refinements may be made to the arrangement of FIGS. 1 and 2 without departing from the claimed invention. For example, LED 101 could be series connected in the anode circuit of SCR 101 to indicate that power is available at the load (i.e. the "on" or closed state) and be turned off each time SCR1 (SCR101) turns on. LED 101 or LED102 may be arranged to blink intermittently or remain lit during an EOL condition, etc.

The aforementioned describes an ELR arrangement, but an ELO arrangement can be easily achieved by a modification of the electromagnetic switch, or by the inclusion of a simple logic latch arrangement. Closing or reclosing of the load contacts would then require a manual reset operation.

This circuit provides considerable advantages over the prior art. It is entirely analog based. If the ST circuit fails for any reason, the contacts will not close or will not remain closed, and thus the RCD has an inbuilt "fail-safe" feature.

The ST pulses are used to draw a test current through the sense CT, thus verifying the efficacy of the test circuit. The test current is limited to a maximum value as specified in relevant product standards.

The invention is not limited to the embodiments described herein which may be modified or varied without departing from the scope of the invention. Those skilled in the art will recognize improvements and modifications to the embodiments of the present disclosure. All such improvements and modifications are considered within the scope of the concepts disclosed herein and the claims that follow.

What is claimed is:

1. A device for detecting a fault in an AC supply, comprising a detection circuit for detecting a fault in an AC supply to a load and providing a corresponding output, a disconnect circuit to disconnect the load from the AC supply in response to an output from the detection circuit, a generator of intermittent test pulses, and a test circuit coupled to the detection circuit and containing a first solid state switch responsive to the test pulses, each test pulse turning on the first solid state switch for the duration of the test pulse so that a current simulating the fault flows intermittently in the test circuit and is detected by the detection circuit, and a corresponding output is provided by the detection circuit, the current flowing intermittently in the test circuit having a higher energy than the test pulses, the device further comprising means to disable the disconnect circuit in response to each test pulse.

2. A device for detecting a fault in an AC supply, comprising a detection circuit for detecting a fault in an AC supply to a load and providing a corresponding output, a disconnect circuit to disconnect the load from the AC supply in response to an output from the detection circuit, a generator of intermittent test pulses, and a test circuit coupled to the detection circuit and containing a first solid state switch responsive to the test pulses, each test pulse turning on the first solid state switch for the duration of the test pulse so that a current simulating the fault flows intermittently in the test circuit and is detected by the detection circuit, and a corresponding output is provided by the detection circuit, the current flowing intermittently in the test circuit having a higher energy than the test pulses, the device further comprising means to disable the disconnect circuit in response to each test pulse, wherein the disconnect circuit includes a second solid state switch which is turned on by the output from the detection circuit to allow a current to flow in the disconnect circuit, and wherein the disabling means includes a third solid state switch in the disconnect circuit in series with the second solid state switch, the disabling means including means to turn off the third solid state switch during an occurrence of a fault simulating current so that a current cannot flow in the disconnect circuit.

3. A fault detecting device as claimed in claim 2, wherein the fault to be detected is a residual current fault.

4. A device for detecting a fault in an AC supply, comprising a detection circuit for detecting a fault in an AC supply to a load and providing a corresponding output, a disconnect circuit to disconnect the load from the AC supply in response to an output from the detection circuit, a generator of intermittent test pulses, and a test circuit coupled to the detection circuit and containing a first solid state switch responsive to the test pulses, each test pulse turning on the first solid state switch for the duration of the test pulse so that a current simulating the fault flows intermittently in the test circuit and is detected by the detection circuit, and a corresponding output is provided by the detection circuit, the current flowing intermittently in the test circuit having a higher energy than the test pulses, the device further comprising means to disable the disconnect circuit in response to each test pulse, wherein the detecting circuit comprises a circuit for detecting a differential current in the AC supply to the load, the differential current having a characteristic indicative of a type of supply fault to be detected, the disconnect circuit comprises an electromechanical switch comprising a coil controlling normally-closed contacts in the AC supply to the load, the normally-closed contacts referred to herein as load contacts, the disconnect circuit being responsive to the output to cause a change in current through the coil sufficient to open the load contacts, and the fault-simulating current flowing in the test circuit causing a differential current, having a characteristic indicative of the type of fault, to flow in the detecting circuit in the absence of the supply fault, the disconnect circuit being inhibited from opening the load contacts in respect of an output from the detecting circuit resulting from a fault-simulating current flowing in the test circuit.

5. A fault detecting device as claimed in claim 4, wherein the load contacts are mechanically latched, and the change in current through the coil increases the current sufficiently to open the contacts.

6. A fault detecting device as claimed in claim 4, wherein the load contacts are electrically latched, and the change in current through the coil decreases the current sufficiently to open the contacts.

* * * * *